US009190286B2

(12) United States Patent
Hu et al.

(10) Patent No.: US 9,190,286 B2
(45) Date of Patent: Nov. 17, 2015

(54) COMPOSITION FOR ADVANCED NODE FRONT-AND-BACK-END OF LINE CHEMICAL MECHANICAL POLISHING

(71) Applicant: Fujifilm Planar Solutions, LLC, Adrian, MI (US)

(72) Inventors: Bin Hu, Mesa, AZ (US); Abhiskek Singh, Freemont, CA (US); Gert Moyaerts, Mesa, AZ (US); Deepak Mahulikar, North Kingstown, RI (US); Richard Wen, Mesa, AZ (US)

(73) Assignee: Fujifilm Planar Solutions, LLC, Adrian, MI (US)

( * ) Notice: Subject to any disclaimer, the term of this patent is extended or adjusted under 35 U.S.C. 154(b) by 0 days.

(21) Appl. No.: 14/598,675

(22) Filed: Jan. 16, 2015

(65) Prior Publication Data

US 2015/0132957 A1      May 14, 2015

Related U.S. Application Data

(62) Division of application No. 12/828,766, filed on Jul. 1, 2010, now Pat. No. 8,961,815.

(51) Int. Cl.
| | |
|---|---|
| *H01L 21/302* | (2006.01) |
| *H01L 21/461* | (2006.01) |
| *H01L 21/306* | (2006.01) |
| *C09G 1/02* | (2006.01) |
| *C09K 3/14* | (2006.01) |
| *H01L 21/3105* | (2006.01) |
| *H01L 21/321* | (2006.01) |
| *H01L 21/768* | (2006.01) |
| *H01L 29/66* | (2006.01) |
| *H01L 21/04* | (2006.01) |

(52) U.S. Cl.
CPC ............ *H01L 21/30625* (2013.01); *C09G 1/02* (2013.01); *C09K 3/1463* (2013.01); *H01L 21/0475* (2013.01); *H01L 21/31053* (2013.01); *H01L 21/31055* (2013.01); *H01L 21/3212* (2013.01); *H01L 21/76819* (2013.01); *H01L 29/66545* (2013.01)

(58) Field of Classification Search
USPC ............................. 252/79.2; 216/89; 438/693
See application file for complete search history.

(56) References Cited

U.S. PATENT DOCUMENTS

2008/0057713 A1 * 3/2008 Desai et al. ................... 438/691
2009/0311864 A1   12/2009 Yamada et al.

OTHER PUBLICATIONS

Taiwan Office Action (with Search Report) dated Mar. 25, 2015 for Taiwan application No. 100121054.

* cited by examiner

*Primary Examiner* — Roberts Culbert
(74) *Attorney, Agent, or Firm* — Ohlandt, Greeley, Ruggiero & Perle, L.L.P.

(57) ABSTRACT

The present disclosure is directed to a highly dilutable chemical mechanical polishing concentrate comprising an abrasive, an acid, a stabilizer, and water with a point-of-use pH ranging from 2.2-3.5 for planarizing current and next generation semiconductor integrated circuit FEOL/BEOL substrates.

18 Claims, 7 Drawing Sheets

Material Removal in Poly-Open Polish Process.

Material Removal in Poly-Open Polish Process.

3D System Level Thorugh-Silicon-Vias Integration Scheme

Typical Normalized Removal Rates for Various Substrates

Typical Normalized Removal Rates by Film Type vs. POU pH

Typical TEOS:Film Selectivity

Zeta Potential vs. pH for Concentrate

Normalized TEOS and Tungsten (W) Removal Rates vs. POU
Hydrogen Peroxide Concentration

COMPOSITION FOR ADVANCED NODE FRONT-AND-BACK-END OF LINE CHEMICAL MECHANICAL POLISHING

CROSS-REFERENCE TO RELATED APPLICATION

The present application is a divisional of U.S. patent application Ser. No. 12/828,766, filed on Jul. 1, 2012, which is herein incorporated by reference.

BACKGROUND OF THE DISCLOSURE

1. Field of the Disclosure

The present disclosure relates to an aqueous slurry for use in chemical mechanical polishing (CMP) of semiconductor substrates. More particularly, the present disclosure relates to an aqueous slurry that is particularly useful for polishing multiple substrates present in complex advanced node structures such as, but not limited to, tetra-ethyl ortho-silicate (TEOS) or similar, interlayer dielectrics, silicon nitride ($Si_xN_y$), silicon carbide (SiC), polysilicon, high k materials, metals, alloys, and co-formed materials thereof.

2. Description of the Related Art

In the semiconductor industry there is a continual drive to reduce the size of integrated circuits, in order to increase the density of active components. In order to achieve higher component density, current research is directed towards utilizing innovative substrate materials and planarization schemes. The problem that arises is that present polishing compositions are incapable of achieving the planarity requirements critical for maximal circuit performance.

As described in U.S. Pat. No. 7,166,506, to Prince et al. and shown in FIG. 1, in the formation of a transistor, an interlayer dielectric is deposited over the device structure, which has a polysilicon gate. This dielectric layer is planarized via CMP until the polysilicon gate is exposed. In the process of FIG. 1, the polysilicon gate is exposed by adequate CMP removal of the dielectric layer, etch stop layer, hardmask, and part of the spacers. In conventional integration schemes, a two step process is required. A CMP composition such as that disclosed in U.S. Pat. Nos. 5,759,917 and 6,027,554 could be used to remove the dielectric layer, but it would have minimal impact on the etch stop layer. A second composition as described in U.S. Pat. Nos. 6,984,588 and 7,217,989 would then be utilized to remove the etch stop layer. Furthermore, should the device structure displayed in FIG. 1 follow a metal gate integration scheme, the polysilicon gate would be removed and replaced by a metal gate such as aluminum. The aluminum deposition would require yet another planarization step, and a third composition.

U.S. Pat. No. 6,255,211 relates to silicon carbide (SiC) integration schemes. FIG. 2 shows a typical scheme associated with 3D system level integration where multiple layers are interconnected using through-silicon-vias (TSV). In the case of 3D system level devices, a very thin layer of SiC serves as a stop layer in the back end of the line (BEOL) processes. While common CMP chemistries (such as those disclosed in U.S. Pat. No. 6,255,211) can achieve relatively high silica to silicon carbide (50:1) selectivity, and can be utilized for SiC barrier schemes, they are not readily applicable to 3D system level device integration, because the SiC polish rate is relatively high, regardless of the selectivity value.

Thus, there is a need for a CMP slurry for enabling the use of innovative substrate materials and planarization schemes, and to enhance the capability of current and previous integration schemes to improve FEOL and/or BEOL CMP. Current slurries are only useful for particular applications, requiring the use of many different kinds of slurries, which adds significantly to the cost of the related processes, because requires users to stock many different slurries.

SUMMARY OF THE DISCLOSURE

The present disclosure provides CMP slurries and concentrates for planarizing current and next generation semiconductor integrated circuit substrates. The concentrate comprises a) an abrasive, b) an acid, c) a stabilizer, and d) water. The present disclosure provides a concentrate which can be highly diluted to form a polishing slurry, which provides peak performance and performance tuning capability within its preferable point-of-use pH range of 2.2-3.5.

With the proven performance on various integrated circuit substrates, the slurries and concentrates of the present disclosure contrast with currently available slurries by providing performance sustenance on current generation integrated circuit substrates while displaying marked advantages for next generation substrates and integration schemes. The slurry of the present disclosure can successfully and controllably remove the dielectric, etch stop, and hardmask layers shown in FIG. 1, allowing for a cost-efficient process with high throughput. The slurry of the present disclosure would also allow for an efficient one-step or multi-step removal process based on the removal rates for different metals shown in FIG. 2, even when the device in question follows a metal gate integration scheme. Furthermore, the slurry of the present disclosure can stop-on-SiC, a feature which will enable 3D system level devices as well as be utilizable for previous SiC integration schemes.

Thus, in one embodiment, the present disclosure provides a highly dilutable concentrate for polishing a substrate for semiconductor integrated circuit devices. The concentrate comprises an abrasive, an acid, a stabilizer, and water. The pH of the concentrate is between 2.2 and 2.9.

In another embodiment, the present disclosure provides a method of polishing a transistor with a slurry, the slurry comprising an abrasive, an acid, a stabilizer, and water, the transistor comprising a polysilicon gate, a hardmask over the polysilicon gate, an etch stop layer over the hardmask, and a dielectric layer over the etch stop layer, the method comprising the step of polishing the dielectric layer, the etch stop layer, the hardmask, and the polysilicon gate with the slurry.

In another embodiment, the present disclosure provides a method of polishing a multi-layer substrate with a slurry, the slurry comprising an abrasive, an acid, a stabilizer, and water, the substrate comprising multiple layers, wherein at least one of the layers is silicon carbide and at least one of the layers is a silica material, the method comprising the step of polishing all of the layers with the slurry.

DETAILED DESCRIPTION OF THE DISCLOSURE

The present disclosure provides a CMP slurries and concentrates for planarizing current and next generation semiconductor integrated circuit substrates. The concentrate comprises a) an abrasive, b) an acid, c) a stabilizer, and d) water. Among the novel features of the concentrate of the present disclosure is the low pH range, which corresponds to a higher weight amount of acid than is typically found in current slurries. The concentrate also uses stabilizers at a lower weight percentage than what is currently available, especially at the point of use POU. The concentrate of the present disclosure can also be diluted up to a very high range, from 0-60×, and still achieve very favorable polishing characteristics. As will be discussed in greater detail below, the concentrates of the present disclosure can thus be used to create CMP slurries that can be used on many different materials and in a variety of substrate polishing applications, which dramatically improves the ease and cost of use of the slurries.

In one embodiment, the concentrate can consist essentially of the abrasive, acid, stabilizer, and water, meaning that any component that assists in the removal of material from a substrate or stabilizes a slurry used for CMP is excluded. In another embodiment, the concentrate consists of the abrasive, acid, stabilizer, and water.

The amount of acid in the concentrate of the present disclosure can be from 0.01 wt %-20 wt %, from 0.05 wt %-3 wt %, from 0.1 wt %-1.0 wt %, or any ranges in between, based on the total weight of the concentrate, and depending on the strength and nature of the acid. The amount of acid in the concentrate is such that the pH of the concentrate is between 2.2 and 2.9. The slurry prepared from this concentrate is adjusted so that the pH of the POU slurry composition will range from 2.2-3.5. This is a major difference between the concentrate and slurries of the present disclosure when compared to those of the prior art. The problem faced by slurries of the prior art was that at low pH values, the removal rates of substrate materials would be favorable, but the abrasive in the concentrates would decay because of the low pH. At higher pH values, the abrasive was stable, but much more of the abrasive would be needed to achieve favorable removal rates, which significantly inflated the cost of ownership of the slurries. The present disclosure has thus solved this problem by providing a concentrate that provides a low pH in both the concentrate and the POU slurry, yet also has high removal rates of substrate materials.

Figure 4:
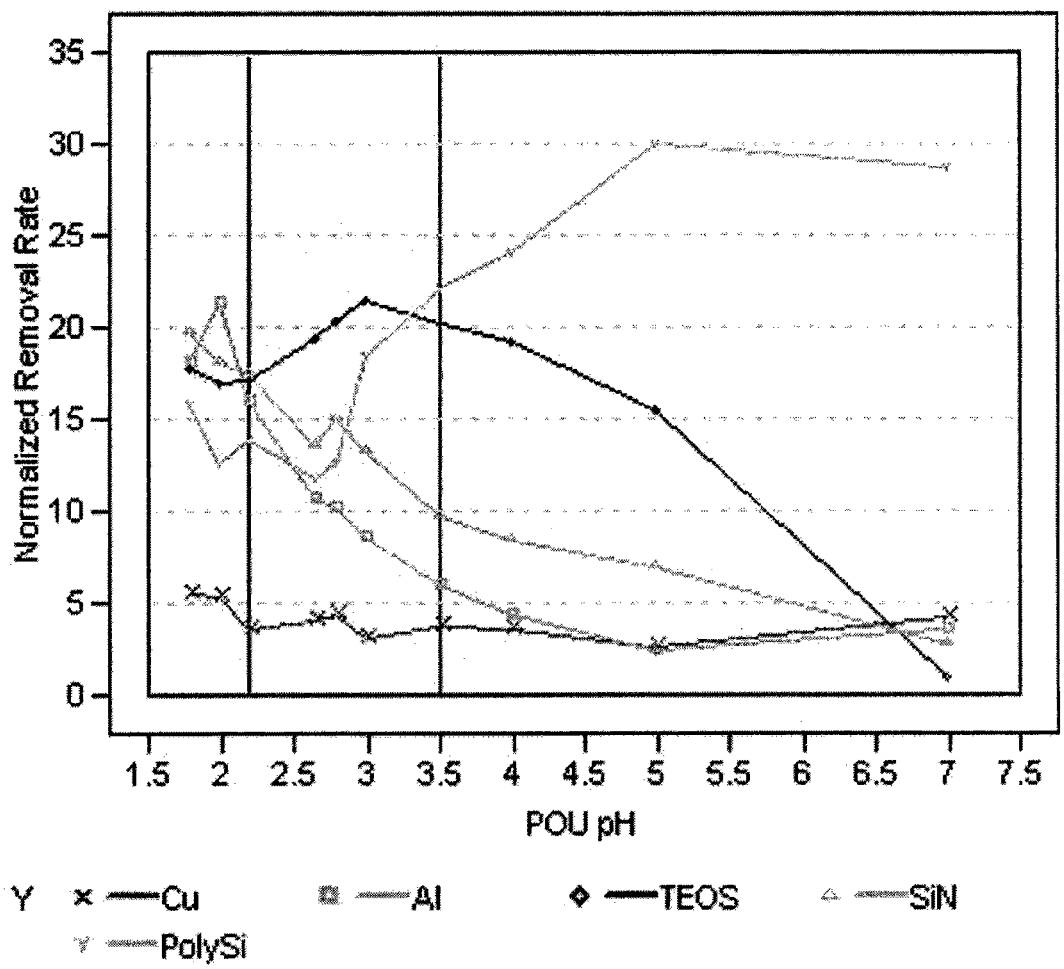
FIG. 4 is a chart that displays the typical normalized removal rates for a variety of current and next generation integrated circuit substrates as a function of point-of-use (POU) pH.
Figure 5:
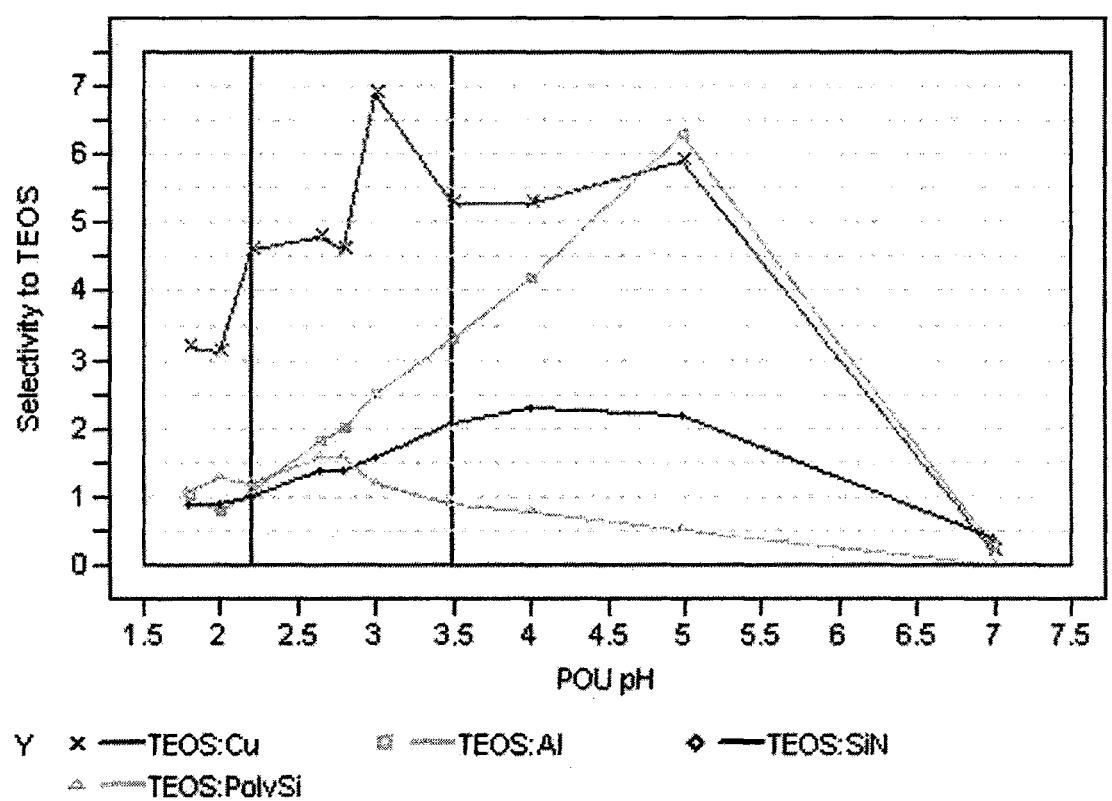
FIG. 5 is a chart that displays the typical selectivity to TEOS for a variety of current and next generation integrated circuit substrates as a function of POU pH.

The pH range of the composition is critical to performance, as displayed in FIG. 4, which shows the normalized removal rates of various substances as a function of pH, when treated with the slurry of the present disclosure. At pH values below 2.2, while the removal rates of various substances can be favorable, harsh acidic conditions damage the substrate and yield inconsistent performance. At pH values greater than 3.5, it can be seen in FIG. 4 that polysilicon removal performance is greatly increased. However, this comes at the cost of performance on various other substrate materials. Should the end-user require selective performance to polysilicon, the present composition can be readily used outside of the pH range indicated. For next generation integration schemes, however, the selective ratio of removal of various deposited substrates will be critical to enabling next generation technologies. The concentrate of the present disclosure utilized within the critical pH range of 2.2-2.9 provides the marked advantage of achieving this task.

The acid of the present disclosure may be an organic acid, and inorganic acid, or mixtures thereof. The type of acid used is not limited so long as it does not impact the performance effects and stability of the present disclosure. Examples of suitable acids for the present disclosure can include, but are not limited to, carboxylic acids such as gluconic acid, lactic acid, citric acid, tartaric acid, malic acid, glycolic acid, malonic acid, formic acid, oxalic acid, sulfonic acid(s), amino acids, aminoacetic acids, inorganic acids such as hydrochloric acid, nitric acid, sulfuric acid, phosphonic acid, phosphoric acid, organo-phosphoric acid, or any mixtures thereof. Strong acids particularly useful, since it can be difficult to achieve the desired low pH for the concentrate with weak acids. In one embodiment, the acid is one or more acids with an acid disassociation constant (pKa) value of less than −2.0.

The abrasive of the concentrate can be any suitable abrasive including, but not limited to, alumina, silica, titania, ceria, zirconia, surface-treated abrasives, along with co-formed products and/or mixtures thereof. The abrasive can be or not be chemically and/or heat treated. In one embodiment, the abrasive in the present disclosure is silica, which can be colloidal silica. The abrasive may be present in the concentrate in any suitable amount, for example from 6 wt %-30 wt %, or 10 wt %-25 wt %, based on a total weight of the concentrate. At the POU, the abrasive can be from 0.2 wt %-30 wt %, or 0.5 wt %-10 wt %, based on the total weight of the POU slurry.

The stabilizer of the present disclosure may be an amine or quaternary ammonium compound. Examples include, but are not limited to, $C_1$-$C_{12}$ alkanols and derivatives thereof, ethanolamine, methylaminoethanol, dimethylaminoethanol, isopropanolamine, tetramethylammonium hydroxide, tetrabutylammonium hydroxide. The amount of stabilizer concentration in the concentrate can be from 0.001 wt %-5 wt %, or from 0.05 wt %-2 wt %, however, additional amounts may be necessary depending on the nature of the grain of the abrasive and the acid chosen. The stabilizer is of critical importance to the present disclosure in order to achieve a stable concentrate with high dilution capability.

Figure 6:
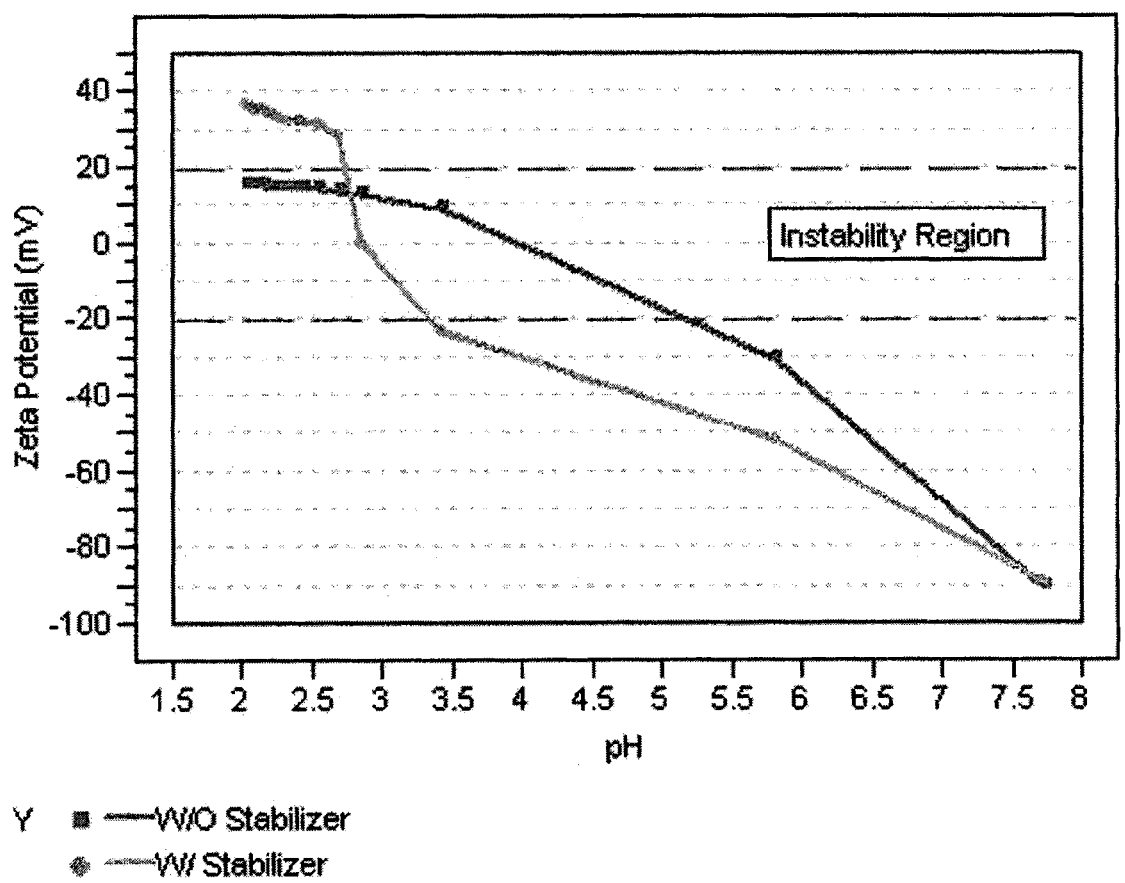
FIG. 6 is a chart that displays the typical zeta potential as a function of pH for the slurry of the present disclosure with and without the use of a stabilizer.

Use of the stabilizer serves to provide electrokinetic potential, which is in the stable regions as displayed in FIG. 6. Without the use of a stabilizer, FIG. 6 displays that a composition will carry unstable colloidal stability which will ultimately lead to particle growth, agglomeration, and/or phase separation. Zeta potential is a measure of electrokinetic potential in colloidal systems, meaning that it measures the charge of the particles in the concentrate, and their propensity to repel or attract each other. The higher the positive or negative value, the more stable the concentrate or slurry is. When approaching zero, the concentrate will be unstable, as the particles will agglomerate. As can be seen in FIG. 6, without a stabilizer the concentrate of the present disclosure is in an unstable region over a broad range of pH values. With a stabilizer, there are only limited pH values over which the concentrate is unstable.

The biggest advantage of a highly dilutable concentrate is the capability to provide the end user with a reduced cost of ownership. The end user is able to dilute the concentrate with water, to formulate the POU slurry for use. The present disclosure provides the user with the ability to tune substrate removal performance as a function of dilution, such that the end user is able to utilize the concentrate to reduce costs and tune for specific processing requirements. The use of concentrates is a challenge, however, because at the high amounts of component concentration (such as acids and abrasives), the stability of the concentrate is adversely affected. As discussed above, this phenomenon is observed because colloidal particle stability is governed by steric and surface effects. In general, the greater the amount of abrasives in a composition, there is a greater likelihood for instability. The concentrate of the present disclosure, however, has proven stability for up to a 30 wt % abrasive concentration, and at very low pH values.

The concentrate of the present disclosure may optionally utilize a biocide for contamination prevention and/or mitigation. The biocide of the present disclosure may be a organotin, salicylanilide, mercaptan, quaternary ammonium compound, or hydrogen peroxide. The general range for the biocide of the present disclosure is 0.001 wt %-8 wt %, based on the total weight of the concentrate. The biocide has also been found to help preserve polysilicon surfaces and serve to enhance tungsten removal when added as a supplement at POU dilution. It has been found that in the concentrate, lower weight ranges of biocide, closer to 0.001 wt %, are suitable, while after the concentrate has been diluted, additional biocide can be added, up to 2 wt %, up to 5 wt %, and up to 8 wt %, based on the total weight of the POU slurry. Again, adding the biocide in these amounts after dilution has been shown to help preserve polysilicon surfaces.

The concentrate can further optionally comprise additives to tune to specific performance criteria. Additives include, but are not limited to, cationic surfactants, anionic surfactants, nonionic surfactants, poly-electrolytes, amphoteric surfactants, benzotriazole, triazole, benzimidazole, hydrogen peroxide, glycerol, and compounds and mixtures thereof.

EXAMPLES

Examples are provided to further illustrate the capabilities of the concentrate of the present disclosure. The provided examples are not intended and should not be construed to limit the scope of the present disclosure.

Example 1

In this example, the concentrate comprises 12 wt % colloidal silica abrasive (such as those provided by Nalco, Fuso, or Nissan corporations), 0.10 wt % quaternary ammonium compound as a stabilizer, and 0.26 wt % of an inorganic acid, such as hydrochloric acid, nitric acid, sulfuric acid, phosphoric acid, to achieve a concentrate pH of 2.2. Various dilutions, using water, were created to measure the removal performance of oxide, polysilicon and silicon nitride ($Si_xN_y$) films, shown in Table 1. For all examples an AMAT Mirra polisher was used with a downforce of 3 psi and a flow rate of 175 mL/min.

TABLE 1

Normalized removal rate vs. dilution factor

| Dilution | POU Abrasives wt-% | TEOS RR | PolySi RR | SiN RR | TEOS:PolySi | TEOS:SiN |
|---|---|---|---|---|---|---|
| 24x | 0.50% | 2.13 | 2.56 | 1 | 0.8 | 2.1 |
| 12x | 1.00% | 3.97 | 3.46 | 3.17 | 1.1 | 1.3 |
| 6x | 2.00% | 7.52 | 4.79 | 5.57 | 1.6 | 1.4 |
| 4x | 3.00% | 9.44 | 5.99 | 8.32 | 1.6 | 1.1 |

The results in Table 1 display feasible removal rates for oxide, polysilicon, and $Si_xN_y$ films at varied dilutions. The results also indicate the capability to tune the present disclosure based on dilution factor as fit for process requirements.

Furthermore, the results display that the selectivity of TEOS to polysilicon and to $Si_xN_y$ holds stable with dilution. The prior art has largely displayed oxide polishing compositions that are polarized away from $Si_xN_y$ film polishing. For example, U.S. Pat. No. 7,365,013 displays selectivity results which are at best a 5:1 TEOS: $Si_xN_y$, which means that several different compositions would need to be used for advanced structures, unlike with the concentrate of the present disclosure. Similarly, U.S. Pat. No. 6,027,554 focuses on a composition based on $Si_xN_y$ powder as the polishing abrasive. This composition is able to achieve very high oxide removal rates, but very weak $Si_xN_y$ rates, yielding a TEOS:SiN selectivity greater than 9:1. Again, this means that several different slurries would have to be used to polish different surfaces. In the slurries disclosed in both U.S. Pat. Nos. 7,365,013 and 6,027,554, dilution is not possible—the compositions are of 12.5 wt % and 10 wt % abrasive. In addition, the compositions have high, alkaline pH values.

The present disclosure displays the capability to dilute as high as 60× depending on the chosen abrasive concentration of the concentrate. The concentrate of the present disclosure is capable of achieving such high dilution because of the utilization of a stabilizer for colloidal particle stabilization. Again, FIG. 6 displays zeta potential as a function of pH for the present disclosure. In FIG. 6, it clearly shows that without the use of a stabilizer, the composition zeta potential lingers over a wide pH range in the region of colloidal instability. With the utilization of a stabilizer, however, the composition displays high level of colloidal stability at low pH and as pH is increased, the zeta potential drops rapidly through the instability region and again regains high stability. It should be noted that even at the isoelectric point of the composition, with the use of the stabilizer, colloidal stability is still maintained. This is clearly a marked advantage of the present disclosure over prior art.

Example 2

In this example, the concentrate comprises 12 wt % colloidal silica abrasive (such as those provided by Nalco, Fuso, or the Nissan corporations), 0.10 wt % quaternary ammonium compound as a stabilizer, and sufficient inorganic acid, such as hydrochloric acid, nitric acid, sulfuric acid, phosphoric acid, to achieve a concentrate pH of 2.2. A POU slurry comprising 3 wt % abrasives was created via dilution with water. The POU pH was then adjusted to create samples ranging from 1.8-7.0 pH. As can be seen from the results in FIG. 4, various removal rates deteriorate severely and simultaneously leading to a drastic variation in selectivity to TEOS for POU pH values beyond 3.5. At pH levels below 3.5, the TEOS, polysilicon, and $Si_xN_y$ removal rates are at acceptable levels, and the selectivity with TEOS and polysilicon or $Si_xN_y$ remains between 1:1-2:1. Beyond a pH of 3.5, however, even when the TEOS: $Si_xN_y$ selectivity remains within an acceptable level, the overall removal rates for both materials drop dramatically, to the point where they are unacceptable. In addition, the polysilicon removal rate escalates with increasing pH, reversing selectivity to TEOS, but again, the removal rate of TEOS at pH levels above 3.5 is unacceptable. Likewise, below a POU pH of 2.2, within wafer and wafer-to-wafer inconsistency is observed, due to the harmful effects of slurry on the substrate.

With respect to the poly-open polish process where an ideal CMP slurry would be capable of controllably removing the dielectric, etch stop, and hardmask layers, the present concentrate displays the capability to do so within the POU pH range of 2.2-3.5. Within this POU pH range, the dielectric and $Si_xN_y$ rates remain robust and the TEOS:SiN selectivity remains less than 2:1. Furthermore, the removal rates for aluminum are greater than 500 Å/min, which are effective values should a metal gate be employed.

The prior art does not reveal a composition that is capable of an effective one-step process to remove the layers defined in this example. For example, U.S. Pat. No. 7,365,013, which utilizes a 12.5 wt % fumed silica composition, can at best achieve a 5:1 TEOS:SiN selectivity as stated in Example 1, and indicates no capability to remove polysilicon, aluminum, or other substrates. Similarly, U.S. Pat. No. 6,027,554, which utilizes a 10 wt % $Si_xN_y$ abrasive, can at best achieve a 9:1 TEOS:SiN selectivity with removal rates which are far too aggressive for such applications. U.S. Pat. No. 6,027,554 also displays no indication of capability to remove polysilicon, aluminum, or other substrates. U.S. Pat. No. 6,984,588, utilizes a pulverized ceria abrasive, and displays effective TEOS and SiN removal rates as well as a favorable selectivity. However, this is achieved utilizing 9 psi downforce process. Those skilled in the art will state this is far too aggressive of a process condition for current and next generation CMP processes. Furthermore, the slurry of the '588 patent has an alkaline pH, and displays no capability for polysilicon, aluminum, or other substrates.

Example 3

In this example, the concentrate comprises 12 wt % colloidal silica abrasive (such as those provided by Nalco, Fuso, Nissan corporations), 0.10 wt % quaternary ammonium compound as a stabilizer, and sufficient inorganic acid, such as hydrochloric acid, nitric acid, sulfuric acid, phosphoric acid, to achieve a concentrate pH of 2.2. In this example, a 3 wt % abrasives POU slurry was created via dilution with water. Table 2 displays the normalized removal performance of the present disclosure on TEOS and silicon carbide (SiC) films.

TABLE 2

| TEOS and silicon carbide normalized removal rates. | | | |
|---|---|---|---|
| DF (psi) | Avg. TEOS RR | Avg. SiC RR | Avg. Cu RR |
| 1 | 45.75 | 1.00 | 10.50 |
| 2 | 80.33 | 2.42 | 11.58 |
| 3 | 101.50 | 3.42 | 17.25 |

Figure 2:
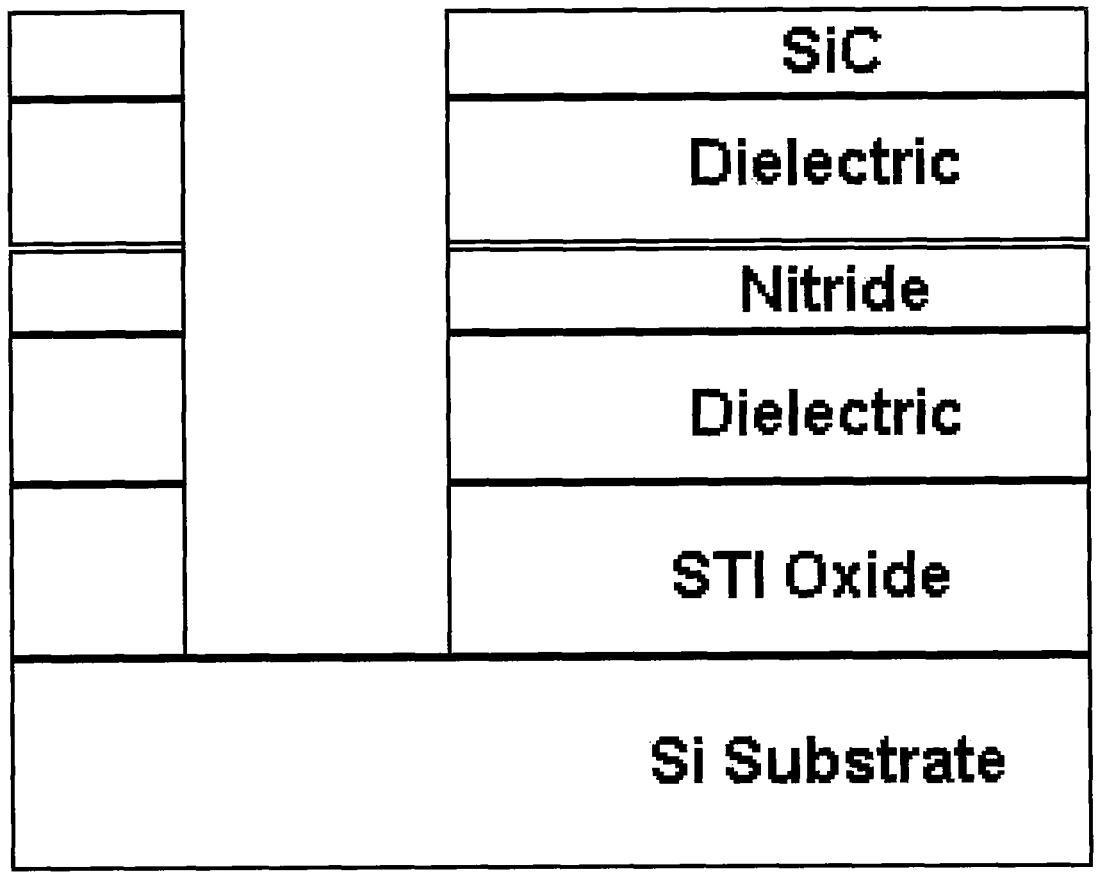
FIG. 2 displays a typical film stack for 3D systems level through-silicon-vias integration scheme.
Figure 3:
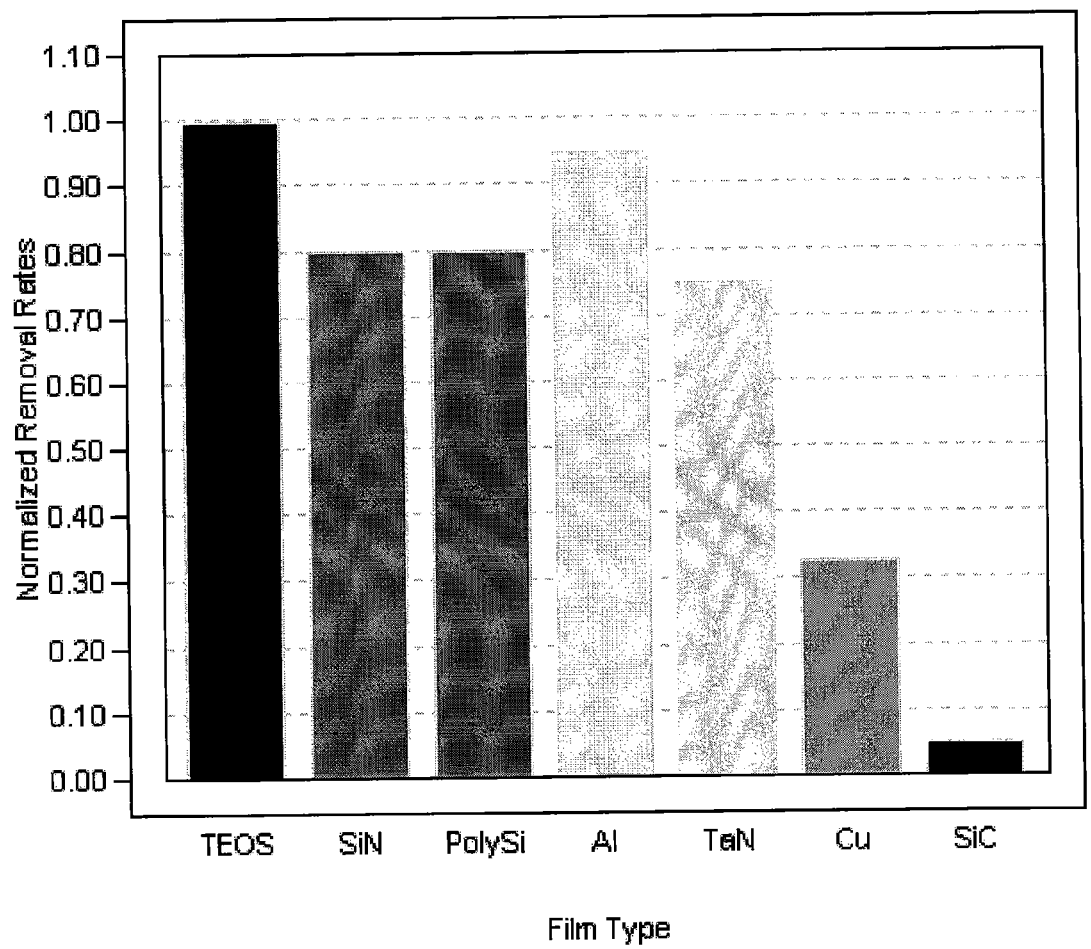
FIG. 3 is a chart that displays the typical removal rates (normalized) for a variety of current and next generation integrated circuit substrate materials.

In the case of 3D system level device integration as shown in FIG. 2, a very thin layer of SiC serves as a stop layer in back end of the line (BEOL) processes. While common CMP chemistries similar to those described in U.S. Pat. No. 6,255,211, which can achieve relatively high silica to silicon carbide (50:1) selectivity can be utilized for current SiC barrier schemes, they are not readily applicable to 3D system level device integration, because the SiC polish rate is relatively high, typically ranging from 100-250 Å/min. This level of removal rate, regardless of the selectivity value, is ineffective for 3D TSV integration where the SiC layer is typically on the order of 300 Å. POU slurries made from the concentrate of the present disclosure are effectively capable of stopping-on-SiC as needed for next generation 3D system level integration schemes. The results in Table 2 display the capability to perform a soft-landing metal (Cu) planarization, followed by an effective stop on a thin layer of silicon carbide, which serves as the barrier layer.

Example 4

In this example, the concentrate comprises 12 wt % colloidal silica abrasive (such as those provided by Nalco, Fuso, or Nissan corporations), 0.10 wt % quaternary ammonium compound as a stabilizer, and sufficient inorganic acid, such as hydrochloric acid, nitric acid, sulfuric acid, phosphoric acid, to achieve a concentrate pH of 2.2. In this example, a 3 wt % abrasives POU slurry was created via dilution with water. The example serves to provide the capability of tuning the surface roughness of, in this case, polysilicon. Utilizing various wt % hydrogen peroxide in the POU slurry, an effective reduction in polysilicon surface roughness is observed as shown in Table 3.

TABLE 3

| Polysilicon surface roughness vs. POU hydrogen peroxide. | |
|---|---|
| POU Hydrogen Peroxide (wt-%) | Polysilicon Rq, Rms (Å) |
| 0.0% | 9.04 |
| 0.1% | 6.65 |
| 0.5% | 3.65 |
| 1.0% | 3.28 |
| 5.0% | 2.61 |

Figure 1:
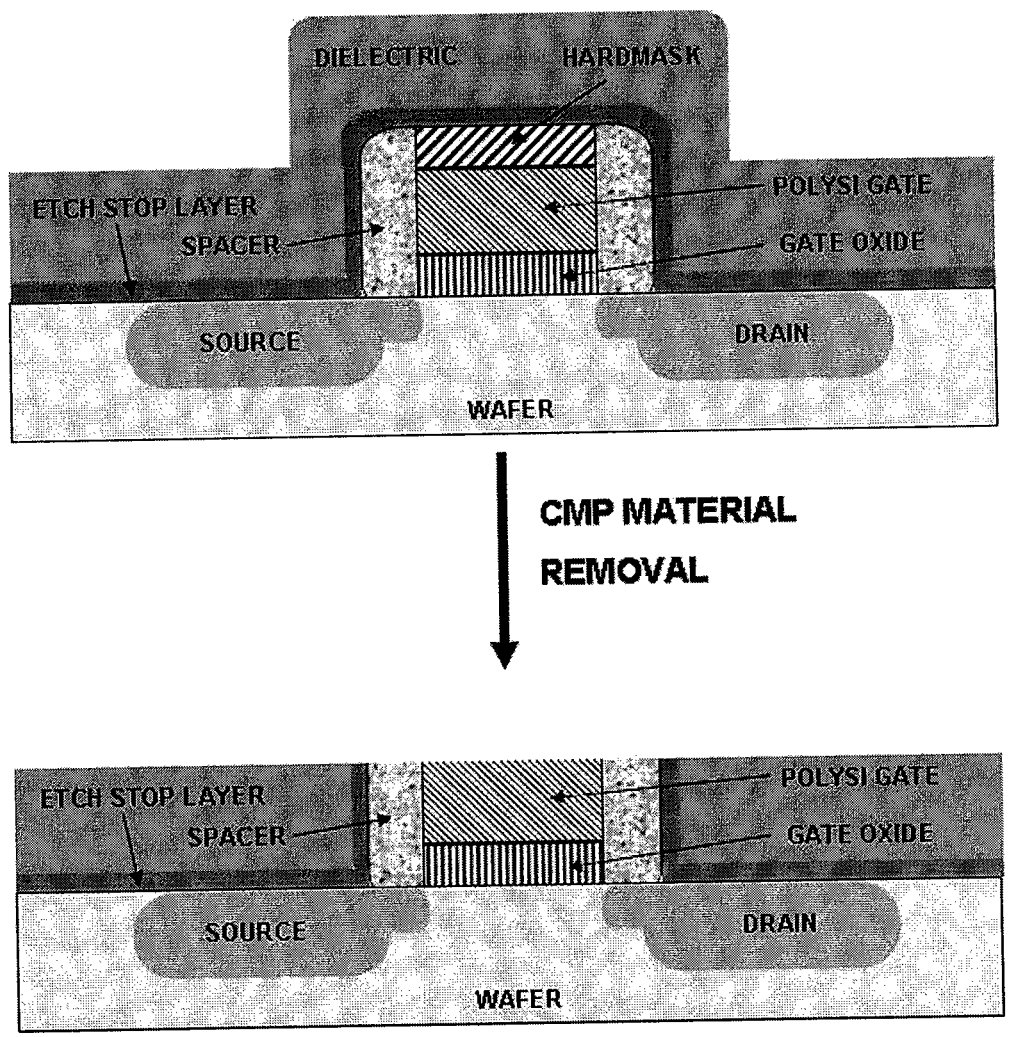
FIG. 1 is a schematic diagram of a current generation device, and the associated material removal step for the poly-open polish process.

The results in Table 3 can be critical to applications and/or application tuning, to minimize localized etching and pitting on polysilicon surfaces. For the poly-open polish integration scheme as defined in U.S. Pat. No. 7,166,506 and shown in FIG. 1, the impact of polishing compositions on the exposed polysilicon gate may impact feature performance. The capability to tune the polysilicon surface as shown with the present disclosure serves as an enable to such defined integration schemes and their associated processes.

Example 5

Figure 7:
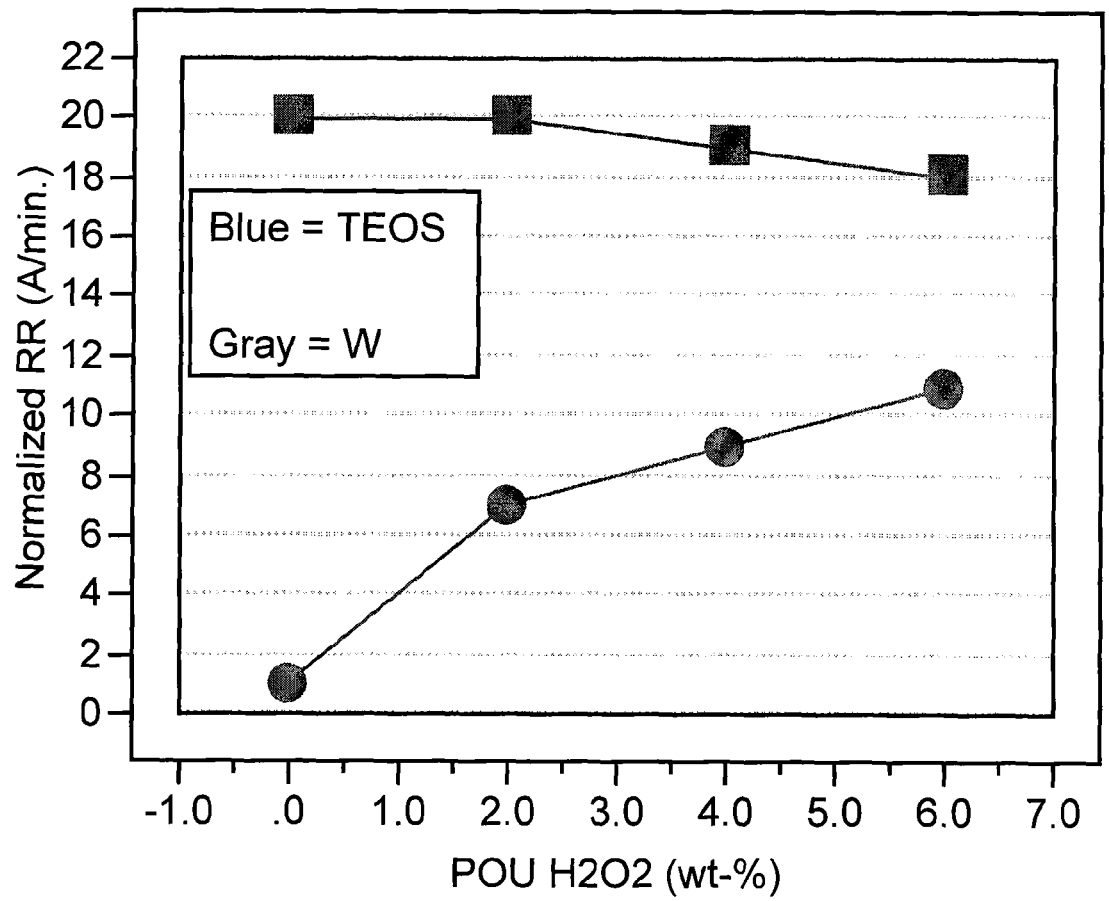
FIG. 7 is a chart that displays the normalized removal rates of TEOS and tungsten as a function of the concentration of biocide in the POU slurry.

In this example, the concentrate comprises 12 wt % colloidal silica abrasive (such as those provided by Nalco, Fuso, or Nissan corporations), 0.10 wt % quaternary ammonium compound as a stabilizer, and 0.26 wt % inorganic acid, such as hydrochloric acid, nitric acid, sulfuric acid, or phosphoric acid, to achieve a concentrate pH of 2.2. In this example, a 3 wt % of abrasive POU slurry was created via dilution with water. The example illustrates how the amount of biocide can enhance tungsten substrate removal. Increasing the hydrogen peroxide in the POU slurry from 0 to 6 wt % yields an 11× increase in tungsten removal rate, as shown in FIG. 7. FIG. 7 also displays that minimal impact is observed on TEOS removal rate with POU supplementation of hydrogen peroxide, thus allowing for TEOS:W selectivity tuning as needed.

The results are indicative that the present disclosure has the capability to be utilized for tungsten removal either in bulk polish and/or buff processes.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A method of polishing a multi-layer substrate with a slurry,
the slurry comprising an abrasive, an acid, a stabilizer, and water, and having a pH of from 2.2 to 3.5,
the substrate comprising a polysilicon gate, a hardmask over said polysilicon gate, an etch stop layer over said hardmask, and a dielectric layer over said etch stop layer,
said method comprising the step of polishing each of said dielectric layer, said etch stop layer, said hardmask, and said polysilicon gate with said slurry.

2. The method of claim 1, wherein the pH of the slurry is between 2.2 and 2.9.

3. The method of claim 1, wherein the slurry comprises:
a) 6 wt % to 30 wt %, based on the total weight of the slurry, of an abrasive selected from the group consisting of alumina, silica, titania, ceria, zirconia, co-formed products thereof, and mixtures thereof;
b) 0.01 wt % to 20 wt %, based on the total weight of the slurry, of an acid selected from the group consisting of gluconic acid, lactic acid, citric acid, tartaric acid, malic acid, glycolic acid, malonic acid, formic acid, oxalic acid, sulfonic acid, amino acid, aminoacetic acid, hydrochloric acid, nitric acid, sulfuric acid, phosphonic acid, phosphoric acid, organo-phosphoric acid, and any mixtures thereof;
c) 0.001 wt % to 5 wt %, based on the total weight of the slurry, of a stabilizer selected from the group consisting of $C_1$-$C_{12}$ alkanols and derivatives thereof, ethanolamine, methylaminoethanol, dimethylaminoethanol, isopropanolamine, tetramethylammonium hydroxide, tetrabutylammonium hydroxide, and any mixtures thereof; and
d) water.

4. The method of claim 1, wherein the abrasive is colloidal silica.

5. The method of claim 1, wherein the acid is present in the concentrate in an amount of 0.05 wt % to 3 wt %, based on the total weight of the concentrate.

6. The method of claim 1, wherein the acid comprises an acid selected from the group consisting of hydrochloric acid, nitric acid, sulfuric acid, phosphonic acid, phosphoric acid, organo-phosphoric acid, and mixtures thereof.

7. The method of claim 1, wherein the slurry further comprises a biocide selected from the group consisting of organotin, salicylanilides, mercaptan, quaternary ammonium compound, hydrogen peroxide, and any mixtures thereof.

8. The method of claim 7, wherein the biocide is hydrogen peroxide.

9. The method of claim 7, wherein the biocide is present in an amount of 0.001 wt % to 8 wt %, based on the total weight of the slurry.

10. The method of claim 1, wherein the slurry further comprises an additive selected from the group consisting of cationic surfactants, anionic surfactants, nonionic surfactants, poly-electrolytes, amphoteric surfactants, benzotriazole, triazole, benzimidazole, hydrogen peroxide, glycerol, and compounds and mixtures thereof.

11. The method of claim 1, wherein at least one of said layers comprises an oxide material, at least one of said layers comprises a polysilicon material, and at least one of said layers comprises a nitride material.

12. The method of claim 1, further comprising polishing said layer comprising an oxide material and said layer comprising a polysilicon material at a removal rate selectivity ratio of from 1:1 to 2:1 for oxide to polysilicon.

13. The method of claim 1, further comprising polishing said layer comprising an oxide material and said layer comprising a nitride material at a removal rate selectivity ratio of from 1:1 to 2:1 for oxide to nitride.

14. A method of polishing a multi-layer substrate with a slurry,
the slurry comprising an abrasive, an acid, a stabilizer, and water, and having a pH of from 2.2 to 3.5,
the substrate comprising multiple layers, wherein at least one of said layers comprises silicon carbide and at least one of said layers comprises a silicon oxide material,
said method comprising the step of polishing all of said layers with the slurry.

15. The method of claim 14, wherein the pH of the slurry is between 2.2 and 2.9.

16. The method of claim 14, wherein the slurry comprises:
a) 6 wt % to 30 wt %, based on the total weight of the slurry, of an abrasive selected from the group consisting of alumina, silica, titania, ceria, zirconia, co-formed products thereof, and mixtures thereof;
b) 0.01 wt % to 20 wt %, based on the total weight of the slurry, of an acid selected from the group consisting of gluconic acid, lactic acid, citric acid, tartaric acid, malic acid, glycolic acid, malonic acid, formic acid, oxalic acid, sulfonic acid, amino acid, aminoacetic acid, hydrochloric acid, nitric acid, sulfuric acid, phosphonic acid, phosphoric acid, organo-phosphoric acid, and any mixtures thereof;
c) 0.001 wt % to 5 wt %, based on the total weight of the slurry, of a stabilizer selected from the group consisting of $C_1$-$C_{12}$ alkanols and derivatives thereof, ethanolamine, methylaminoethanol, dimethylaminoethanol, isopropanolamine, tetramethylammonium hydroxide, tetrabutylammonium hydroxide, and any mixtures thereof; and
d) water.

17. The method of claim 14, wherein the acid comprises an acid selected from the group consisting of hydrochloric acid, nitric acid, sulfuric acid, phosphonic acid, phosphoric acid, organo-phosphoric acid, and mixtures thereof.

18. The method of claim 14, further comprising polishing said layer comprising silicon carbide and said layer comprising a silicon oxide material at a removal rate selectivity ratio of from 1:0.1 to 1:5 for oxide to polysilicon.

* * * * *